United States Patent
Grassl et al.

(10) Patent No.: US 10,403,949 B2
(45) Date of Patent: Sep. 3, 2019

(54) RE-FILTERS FOR PIM MEASUREMENTS AND A TEST BENCH UTILIZING THE SAME

(71) Applicant: SPINNER GmbH, München (DE)

(72) Inventors: Martin Grassl, Erding (DE); Günther Kaiser, Rosenheim (DE)

(73) Assignee: SPINNER GMBH, München (DE)

( * ) Notice: Subject to any disclaimer, the term of this patent is extended or adjusted under 35 U.S.C. 154(b) by 0 days.

(21) Appl. No.: 16/053,303

(22) Filed: Aug. 2, 2018

(65) Prior Publication Data
US 2018/0342779 A1 Nov. 29, 2018

Related U.S. Application Data

(63) Continuation of application No. PCT/EP2017/052429, filed on Feb. 3, 2017.

(30) Foreign Application Priority Data

Feb. 5, 2016 (EP) .................... 16154517

(51) Int. Cl.
*G01R 31/02* (2006.01)
*H01P 1/213* (2006.01)
(Continued)

(52) U.S. Cl.
CPC .............. *H01P 1/2136* (2013.01); *G01R 1/24* (2013.01); *H01P 1/208* (2013.01); *H01P 1/2053* (2013.01); *H01P 5/16* (2013.01); *H01P 7/04* (2013.01)

(58) Field of Classification Search
CPC .......... H01P 1/2053; H01P 7/04; H01P 1/202; H01P 1/2084; H01P 1/2056; H01P 7/10;
(Continued)

(56) References Cited

U.S. PATENT DOCUMENTS

| 4,307,357 A * | 12/1981 | Alm | H01P 1/2053 |
| | | | 333/206 |
| 5,329,687 A * | 7/1994 | Scott | H01P 1/205 |
| | | | 29/527.2 |

(Continued)

FOREIGN PATENT DOCUMENTS

| CN | 101627503 A | 1/2010 |
| CN | 106537686 A | 3/2017 |

(Continued)

OTHER PUBLICATIONS

International Standard IEC 62037-1, "The International Electrotechnical Commission (IEC), Passive RF and Microwave Devices, Intermodulation Level Measurement, Part 1: General Requirements and Measuring Methods". (May 2012) 20 pages.

(Continued)

*Primary Examiner* — Vinh P Nguyen
(74) *Attorney, Agent, or Firm* — Yakov S. Sidorin; Quarles & Brady LLP (57) ABSTRACT

A PIM test bench including a first duplexer, having a first port connected via a first filter to a third port and a second port connected via a second filter to the third port. The first port is fed by signal sources providing RF signals at first and second frequencies. A spectrum analyzer is connected to the second port. A device under test is connected between said third port and a third port of a second duplexer. Each of the first and second ports of the second duplexer is connected to a PIM optimized load and/or a standard load. The second duplexer is preferably identical to the first duplexer. For minimizing self-intermodulation, at least the first duplexer comprises at least one filter component and a metal housing. The housing further includes a monolithic metal body and a metal cover capacitively coupled to the body without any galvanic contact.

20 Claims, 9 Drawing Sheets

(51) Int. Cl.
*H01P 1/205* (2006.01)
*H01P 1/208* (2006.01)
*G01R 1/24* (2006.01)
*H01P 5/16* (2006.01)
*H01P 7/04* (2006.01)

(58) Field of Classification Search
CPC ...... H01P 1/208; H01P 1/2135; H01P 11/008; H01P 1/205; H01P 1/2136; H01P 11/007; H01P 1/2086; H01P 7/105; H01P 1/20336; H01P 1/20381; H01P 1/2088; H01P 5/04; H01P 7/06; H01P 1/201; H01P 1/20345; H01P 1/207; H01P 1/2082; H01P 1/213; H01P 1/2138; H01P 5/024; H01P 7/005; H01P 1/20363; H03H 9/462; H03H 9/50; H03H 2001/0085; H03H 7/12; G01R 23/16; H01Q 1/246; H01Q 23/00
See application file for complete search history.

(56) References Cited

U.S. PATENT DOCUMENTS

| | | | |
|---|---|---|---|
| 8,362,855 B2 | 1/2013 | Lee | |
| 8,742,869 B2 | 6/2014 | Hershtig | |
| 9,190,707 B2* | 11/2015 | Hedemaki | H01P 1/2053 |
| 9,306,261 B2 | 4/2016 | Henrie et al. | |
| 9,647,306 B2* | 5/2017 | Darling | H01P 1/2053 |
| 10,084,222 B1* | 9/2018 | Chun | H01P 7/04 |
| 10,205,214 B2* | 2/2019 | Karhu | H01P 7/105 |
| 2006/0135092 A1* | 6/2006 | Mayr | H01P 7/04 |
| | | | 455/125 |
| 2009/0237185 A1* | 9/2009 | Raty | H01P 1/2053 |
| | | | 333/209 |
| 2014/0218130 A1 | 8/2014 | Lecam et al. | |
| 2017/0222313 A1* | 8/2017 | Markof | H01Q 1/246 |

FOREIGN PATENT DOCUMENTS

| | | |
|---|---|---|
| CN | 107251332 A | 10/2017 |
| DE | 102014011514 A1 | 2/2016 |
| JP | S63308401 A | 12/1988 |
| JP | 2001211007 A | 8/2001 |
| JP | 2010509881 A | 3/2010 |
| WO | 9301625 A1 | 1/1993 |
| WO | 2008029522 A1 | 1/2010 |

OTHER PUBLICATIONS

Baoguo, Y., et al., "Passive Intermodulation Analyzer for Satellite Communication Antenna," IEEE 12th International Conference on Electronic Measurement & Instruments (2015) pp. 1039.

Ming, Y., et al., "Relative Phase Measurement of Passive Intermodulation Products," IEEE 12th International Conference on Electronic Measurement & Instruments (2015) pp. 1072-1076.

Weinstein, D., et al., "Passive Intermodulation Distortion in Connectors, Cable and Cable Assemblies," XP-002330778 (1997) 9 pages.

Office Action issued in related Chinese Patent Application 201780009447.7, dated May 7, 2019.

* cited by examiner

RE-FILTERS FOR PIM MEASUREMENTS AND A TEST BENCH UTILIZING THE SAME

CROSS-REFERENCE TO RELATED APPLICATIONS

This application is a continuation of the pending International Application No. PCT/EP2017/052429 filed on Feb. 3, 2017, which designates the United States and claims priority from the European Application No. 16154517.3 filed on Feb. 5, 2016. The disclosure of each of the above-identified applications is incorporated herein by reference.

BACKGROUND

1. Field of the Invention

The invention relates to filter structures for Passive Inter-Modulation (PIM) measurements of RF signals.

2. Description of Relevant Art

Intermodulation of RF signals is normally referred to as an issue in nonlinear devices such as amplifiers or mixers where the combination of several frequencies creates various intermodulation products even at low power levels. In case of two sinusoidal signals of different frequencies and the intermodulation products will have the following frequencies:

$$f_{IM} = |k_1 f_1 \pm k_2 f_2|$$

$k_1$ and $k_2$ are natural numbers and $k_1 + k_2$ is the order of the intermodulation product.

In practice, intermodulation products can even occur in passive components which are normally referred to as linear—such as cables or filters. It is then referred to as "Passive Intermodulation" or "PIM". The PIM can be caused by the use of magnetic materials or poor galvanic RF contacts, which exhibit operational nonlinearity. As these are rather weak sources, PIM usually only becomes apparent at much higher power levels compared to the intermodulation products in semiconductor devices.

Immense problems can be caused in a mobile communication system by that effect. When for example, two carriers are transmitted at the band edge of the TX band of LTE 800. One intermodulation product will be located in the RX band acting as an additional distortion which degrades the signal-to-noise ratio. As this distortion can't be filtered out by any means it is crucial that as little as possible is created by all the components of the system. This is the reason why the testing of mobile communication infrastructure components regarding PIM plays an important role in the manufacturing process.

The methods for PIM measurements are standardized and described for example in IEC 62037-1. Signals in a first frequency or frequency range are applied to a DUT (device under test) and the intermodulation signals generated by the DUT are measured in a second frequency or frequency range. Contributions to the measurement uncertainty of such a system are the limited accuracy of the power of the two carrier signals and the self-intermodulation of the PIM test bench and the PIM optimized load. A difference of at least 10 dB is necessary between the test bench intermodulation and the intermodulation of the device under test to have an acceptable measurement error of less than 3 dB. Since many mobile communication infrastructure components are specified with −165 dBc, it would be necessary to have test devices with a self-intermodulation better −175 dBc. Unfortunately, such test devices are not commercially available at the moment.

A method for mitigating PIM is disclosed in U.S. Pat. No. 9,306,261 B2. This method is limited to PIM caused by ferromagnetic conductive metals.

The most critical component in a PIM measurement device is the duplexer which splits up the reflected PIM created by a DUT (Device Under Test) to a separate output port where the power level can be measured. Provided that the filter selectivity is sufficient to avoid any secondary effects such as the creation of PIM in the receiver or the transmission of PIM created in the amplifiers to the test port, the residual PIM of the measurement device will mainly be caused by the duplexer's own passive intermodulation.

A comb-line filter which may be used for a duplexer is disclosed in U.S. Pat. No. 4,307,357. Actually, the self-intermodulation of such a filter is higher than the PIM of modern communication components.

U.S. Pat. No. 8,742,869 B2 discloses improved diplexers with low-PIM capacitors. This helps to improve the self-intermodulation to −156 dBc, which is still about 20 dB away from the required value.

U.S. Pat. No. 8,362,855 B2 discloses a filter with reduced PIM. It uses a special bolting technique to improve the galvanic contact between a housing cover and a housing body.

SUMMARY

The embodiments are directed to providing an improved PIM test bench and to providing an improved duplexer. A further aspect relates to improve low-PIM filters. Preferably, the PIM test bench and the duplexer have a self-intermodulation of better than −175 dBc.

A long lasting series of tests and measurements have shown that the PIM of filter structures and specifically of duplexers is still limited by the galvanic contact between a housing body and a cover enclosing the duplexers.

The top of the filter housing body is never perfectly flat. Thus it is very difficult to provide sufficient contact pressure over the whole contact area between the housing body and the cover. In an assembled state, slight movements can occur due to the release of tensions inside the material of the filter housing body. This can result in a change of the contact quality over time. Additionally, tuning elements are needed to tune the filter structure to the desired frequency response. These elements normally have galvanic contacts to the filter housing body or cover as well and the movement during tuning can cause metal particles to penetrate inside the filter. Any galvanic contact also can change its properties due to chemical reactions with the atmosphere such as oxidation. Vibration and shock during transportation might also degrade the galvanic contacts inside the filter structure. Long-term stability issues might arise by these mechanisms. But even if the filter structure is stable, the residual PIM that can be achieved with a conventional design is typically only in the order of −170 dBc at +43 dBm carrier power over the whole filter bandwidth which actually is not enough to test components better than −165 dBc.

In an embodiment, opposite to the teaching of prior art, any galvanic contact between the housing body and the cover has to be avoided. In addition there must be a strong capacitive coupling therebetween to provide a low impedance between the housing body and the cover.

Preferably, the duplexer has a monolithic housing body most preferably made by milling from metal—such as aluminum, for example, or another suitable material. There may be coaxial resonator rods which may be part of the housing body. An aluminum cover preferably is capacitively coupled to the filter housing body without (devoid of, in absence of) a galvanic contact. This may be achieved by proving a dielectric layer, which may be a coating of the metal cover and/or the metal body. Preferably, the meal cover has a dielectric layer, at least at surfaces oriented towards (facing) the housing body or over the whole surface of the metal cover. It is further preferred, if the body has a dielectric layer, at least at surfaces oriented towards (facing) the housing cover or at/over the whole surface of the metal body.

Preferably, the dielectric layers mentioned herein have a thickness in a range of 2 μm to 200 μm. Most preferably, the range is between 10 μm and 30 μm. The layer may include an anodized layer, an oxide, any ceramic material, a paint, a plastic film, a polymer material, or any combination thereof.

The cover preferably is fixed to the housing body by glass fiber reinforced plastic screws. This avoids any galvanic contact between the cover and the body by the screws.

Input and output couplings of the filters may be capacitive. These couplings preferably are part of the monolithic inner conductor for the respective external connectors. Tuning elements for the resonators preferably are made of aluminum oxide. All inter-resonator couplings preferably are made of aluminum and are preferably coated in the same way as the cover. As a consequence, the cover and the tuning elements are only coupled by the capacitance between them. There is no galvanic contact. A fixing element such as a nut fixing the tuning elements is also preferably insulated such that it does not make (establish) galvanic contact either to the tuning element or to the cover. There may be a dielectric sleeve between a fixing nut and a tuning element. Furthermore, at least one tuning element may have a dielectric layer at its outside to prevent any galvanic contact with the cover. In general, preferably all elements of the filters are monolithic parts and the junctions between the elements have a dielectric layer in between to avoid galvanic contact. Preferably all the capacitances between the several monolithic elements are designed to provide capacitive coupling without galvanic contact, such that they provide an impedance low enough to be an adequate replacement for a galvanic contact in the desired frequency range, but without the negative effect on linearity. In other words, each capacitance of capacitances formed among the monolithic elements of the filter is configured to have impedance substantially equal to impedance of a galvanic contact in a pre-defined frequency range while not negatively affecting linearity of such capacitance that remains a linear element.

Tests have shown, that the screening effectiveness of the body covered by the cover is not sufficient to avoid incorrect measurement results by random signals caught from the environment. To improve shielding, an additional shield formed as a cap may be mounted above the filter cover which is connected to the filter housing body by contact strips, preferably made from beryllium-copper. Actually, this is a galvanic contact, but it is outside the filter structure and therefore it is strongly decoupled from the carrier signals. The PIM created by that contact is also decoupled from the PIM output port. Thus, that additional cap is a good compromise to achieve a sufficient screening effectiveness better than 110 dB without influencing the residual PIM of the duplexer significantly. The outer conductors of the port connectors of the duplexer may also contact the filter housing body directly. As the contact area here is small, the unevenness plays a secondary role as well as the release of tensions in the filter housing body. Therefore, a galvanic contact is acceptable here.

One drawback of the presented design features has to be mentioned. Because of the non-contacting filter cover the achievable input port isolation is limited. The capacitance between housing body and cover at the ridge between the two filter paths acts like a block capacitance to ground exhibiting low pass behavior with limited isolation between the paths depending on the frequency range. For that reason the duplexer presented here has been designed with a port isolation of only 60 dB. The approx. 120 dB isolation desired for PIM measurement devices is achieved by additional filters connected to the first port and the second port of the duplexer. The requirements for these additional filters regarding PIM is much lower so commercially available standard products can be used.

In a further embodiment, the load is improved, which further reduces self-intermodulation of the test bench. Here, the test bench is terminated with a second duplexer, connected to the third port of the duplexer of the test bench. The TX output of the second duplexer is connected to a PIM-optimized load, the RX output is terminated with an ordinary 50 Ohm load. The purpose of the second duplexer is to block the PIM signal created by the PIM-optimized load so that it cannot travel to the test port of the PIM analyzer. Preferably, the second duplexer has the same capacitive coupled cover as the duplexer described above. Most preferably, the second duplexer is a duplexer that is identical to (structured/configured in the same fashion as) the first duplexer.

A duplexer for PIM analyzers and a PIM test bench comprising at least one such duplexer provides reduced self-intermodulation and therefore allows PIM measurements to lower levels due to the absence of any galvanic contact inside the filter structure. By that, the creation of PIM is minimized and the long-term stability issues of galvanic contacts are avoided.

The basic concept of the duplexer housing described herein is not limited to a duplexer but may also be applied to any filter or even any housing of electronic components, where low PIM is required. Basically, a housing comprises a monolithic metal body, preferably machined from one piece, and a metal cover capacitively coupled to the body without any galvanic contact. Preferably, a shield is provided covering the cover. The shield may have at least one body contact surface by which it is in galvanic contact with at least one shield contact surface of the shield. The cover may have a dielectric layer, at least at surfaces oriented towards the housing body or at its whole surface. The body may have a dielectric layer, at least at surfaces oriented towards the housing cover or at its whole surface. Preferably, the body has a cover coupling surface geometrically matching a body coupling surface of the cover (that is, the cover coupling surface and the body coupling surface are substantially the same in size and contour, spatially co-extensive), and at least one of the cover coupling surface and the body coupling surface may have a dielectric layer. The dielectric layer may comprise at least one of a coating, an oxide layer and a galvanic layer. The cover may be fixed to the housing body by means comprising insulating material, preferably by any of glass fiber reinforced plastic screws, bolts, and pins.

The filter may comprise at least one coaxial resonator rod. Preferably, at least one of the coaxial resonator rods is (forms, is configured as) at least part of the housing body. It is preferred, if the filter is a duplexer. It is further preferred, if the duplexer has a first port connected via a first bandpass filter to a third port and a second port connected via a second bandpass filter to the third port. Most preferably, the filter is a duplexer comprising six elliptic cavity filter elements (preferably utilizing two triplets of cavity filter elements).

Herein the term RF signal(s) refers to and denotes any high frequency, radio frequency, microwave or millimeter wave signal(s). The term DUT means and refers to a Device Under Test, an object to be tested by the test bench. The terms filter or filter structure(s) relate to frequency-selective or direction-selective electronic components. Examples of filters are high pass filters, low pass filters, bandpass filters and/or directional couplers. Filter components are electronic components which are used in filters. Examples of such filter components include inductors, capacitors and resonators including dielectric resonators and resonating cavities.

BRIEF DESCRIPTION OF THE DRAWINGS

In the following, the invention will be described in reference to examples of embodiments and the drawings, without limitation of the general inventive concept.

While a given implementation of invention can be modified and assume alternative forms, specific embodiments of the invention are shown as examples. The drawings and detailed description below are not intended to limit the implementation of the invention to the particular form(s) disclosed, but include all modifications, equivalents and alternatives within scope of the present invention as defined by the appended claims.

DETAILED DESCRIPTION

Figure 1:
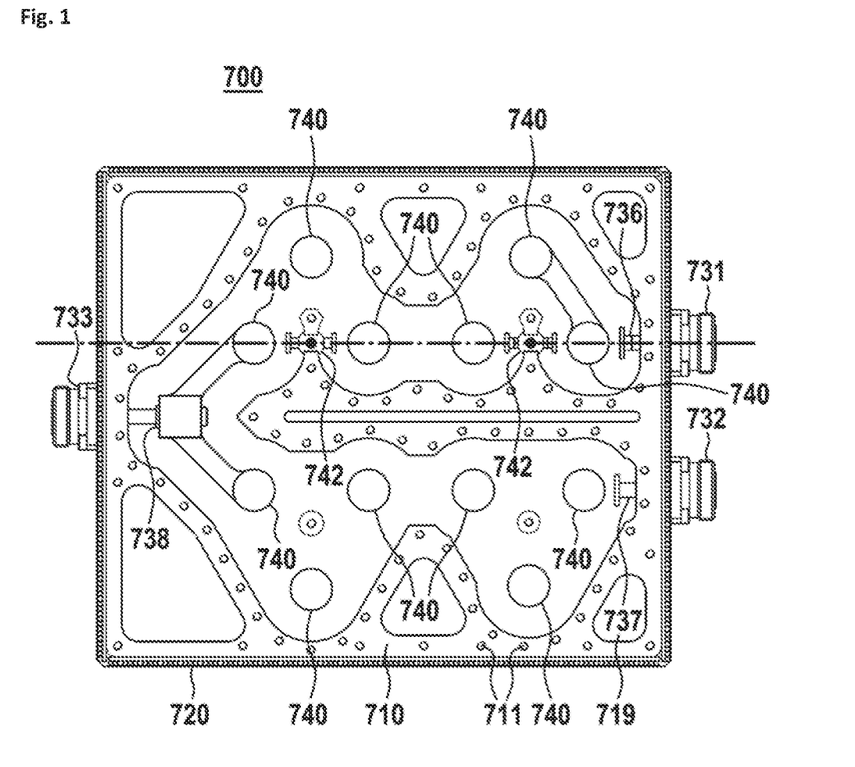
FIG. 1 shows a first embodiment in a top view.
Figure 5:
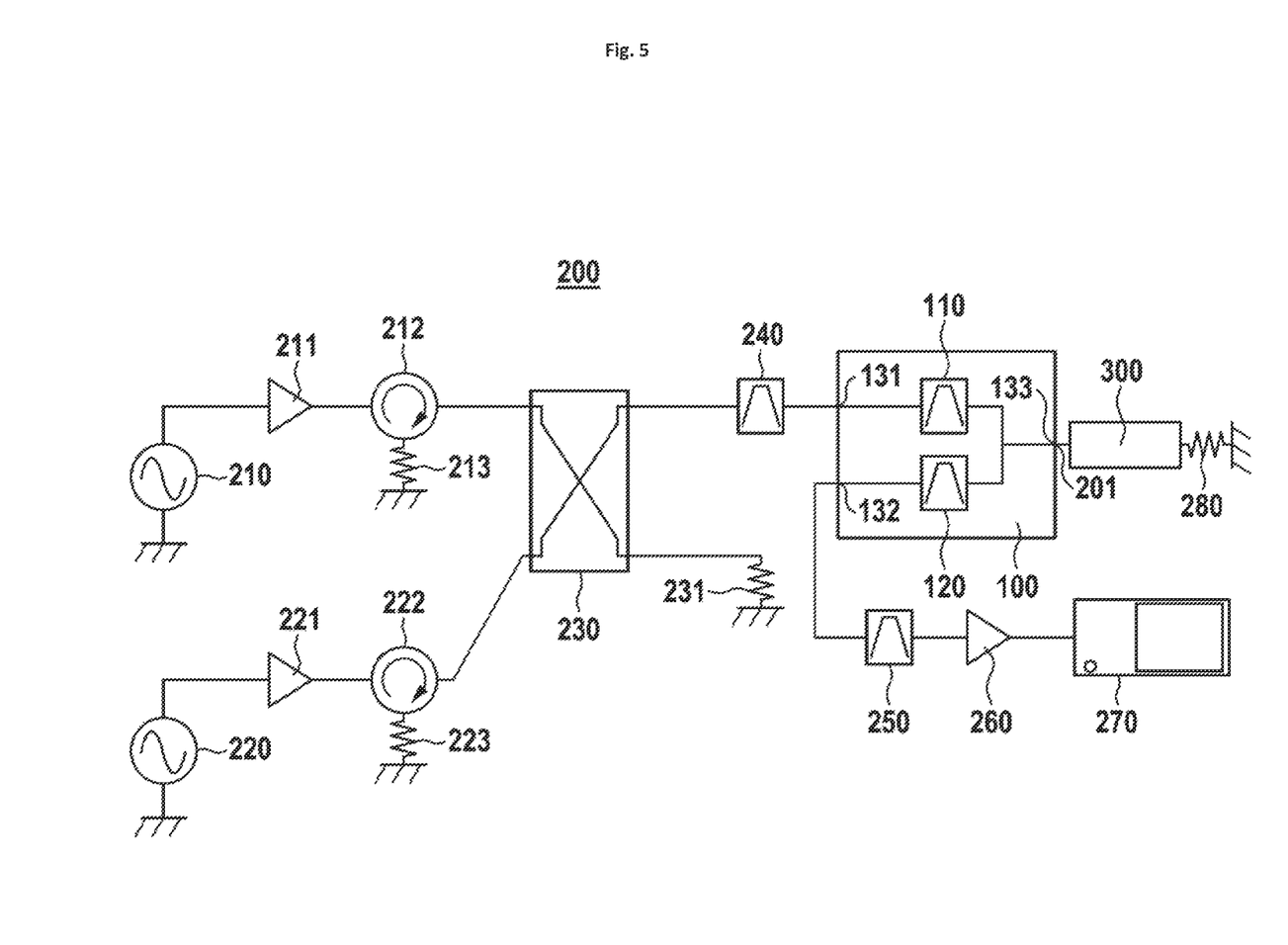
FIG. 5 shows a PIM measurement setup.

In FIG. 1 a first embodiment is shown. It shows a top view of a housing body of a duplexer which may be used for Passive InterModulation (PIM) measurements. A circuit diagram of a PIM test bench using this duplexer is shown in FIG. 5. There, the filter has reference number 100. The example housing body shown is part of a combined filter. Both the RX path between a second port connector 732 and a third port connector 733, as well as the TX path between a first port connector 731 and the third port connector 733 have six elliptic cavity filters utilizing two triplets of cavity filters to achieve the necessary steepness of the filter edge by creating two transmission zeros in the stopband of every path. The two paths are combined with a common node.

Preferably, the duplexer has a monolithic housing body 700 most preferably made by milling from metal—such as aluminum or any other suitable conductive material. The housing preferably contains filter components such as resonator rods 740 or inter-resonator couplings 742. It may also form resonator cavities. The coaxial resonator rods 740 preferably are part of that housing body. A metal cover 780, preferably comprising aluminum, is capacitively coupled to the filter housing body 700 without any galvanic contact. This may be achieved by coating the cover 780 with a thin dielectric layer. Preferably, the dielectric layer has a thickness in a range of 2 μm to 200 μm. Most preferably, the range is between 10 μm and 30 μm. The dielectric layer may comprise an anodized layer, an oxide, any ceramic material, paint, a plastic film, a polymer material or any combination thereof. In addition or alternatively, housing body 700 or at least a cover coupling surface 710 of the housing, to which the cover is attached, is coated with such a thin dielectric layer. The cover 780 preferably is fixed to the housing body 700 by insulated screws 782, which preferably are made of glass fiber reinforced plastic. Internal walls may separate the filter sections from each other and hollow spaces 719. There may be threaded screw holes 711 in the housing body.

Any of the following features may be used alone or in any combination in the filter:

The input and output couplings 736, 737, 738 to the connectors 731, 732, 733 of the filters may be capacitive. These couplings preferably are part of the monolithic inner conductor for the respective connector 731, 732, 733. The tuning elements 741 for the resonators 740 preferably are made of aluminum oxide or any other suitable dielectric material. All inter-resonator couplings 742 preferably are made of aluminum and have a dielectric layer and are preferably coated in the same way as the cover. As a consequence, the metal cover 780 and the tuning elements are only coupled by the capacitance between them. There is no galvanic contact present between the metal cover and the tuning elements. The nuts 745 fixing the tuning elements are also preferably insulated such that they preferably do not make or form galvanic contact with either the tuning element and/or the cover. Insulation of at least one tuning element may be carried out by forming a dielectric layer at the cover and/or at the at least one tuning element and/or with the use of a dielectric sleeve configured to hold such at least one tuning element. In general, preferably all elements of the filters are configured as monolithic parts or elements, with either the housing 700 or the cover 780 and the junctions between the elements having a dielectric layer judiciously disposed to avoid galvanic contact. Preferably, the monolithic elements are configured such that all the capacitances formed between the several monolithic elements establish capacitive coupling without presence of a galvanic contact, and, at the same time, the capacitances are such that they provide impedance that is sufficiently low and substantially equal to impedance of a galvanic contact. As a result, so-configured capacitances are employed as an adequate replacement for a galvanic contact in the desired frequency range (1700-1900 MHz, 870-890 MHz without limitations), while being linear elements—that is, without producing a negative effect on linearity of operation (as may be exhibited by poor galvanic contacts).

Figure 2:
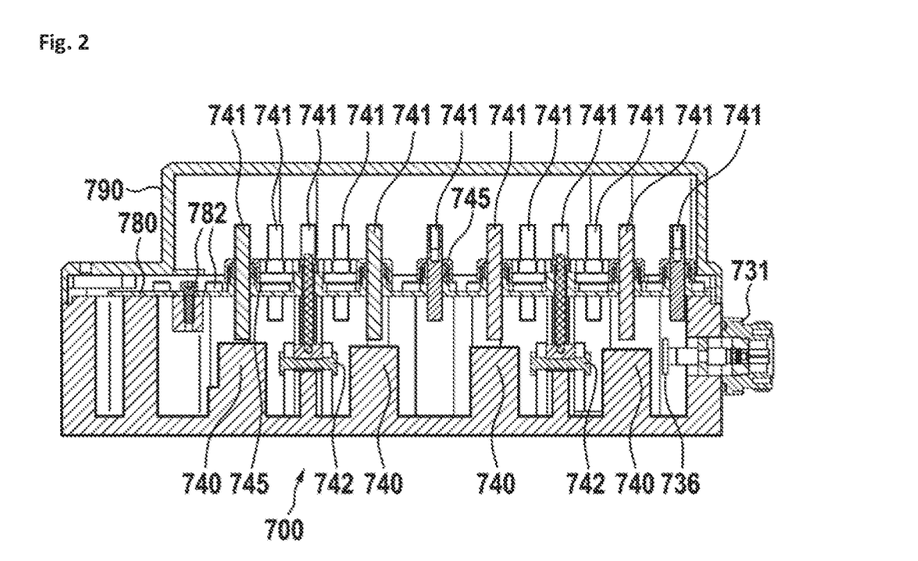
FIG. 2 shows a sectional side view of the duplexer.

FIG. 2 shows a sectional side view of the duplexer. Here, the coaxial resonator rods 740 being one part with the housing body 700 are shown.

Figure 3:
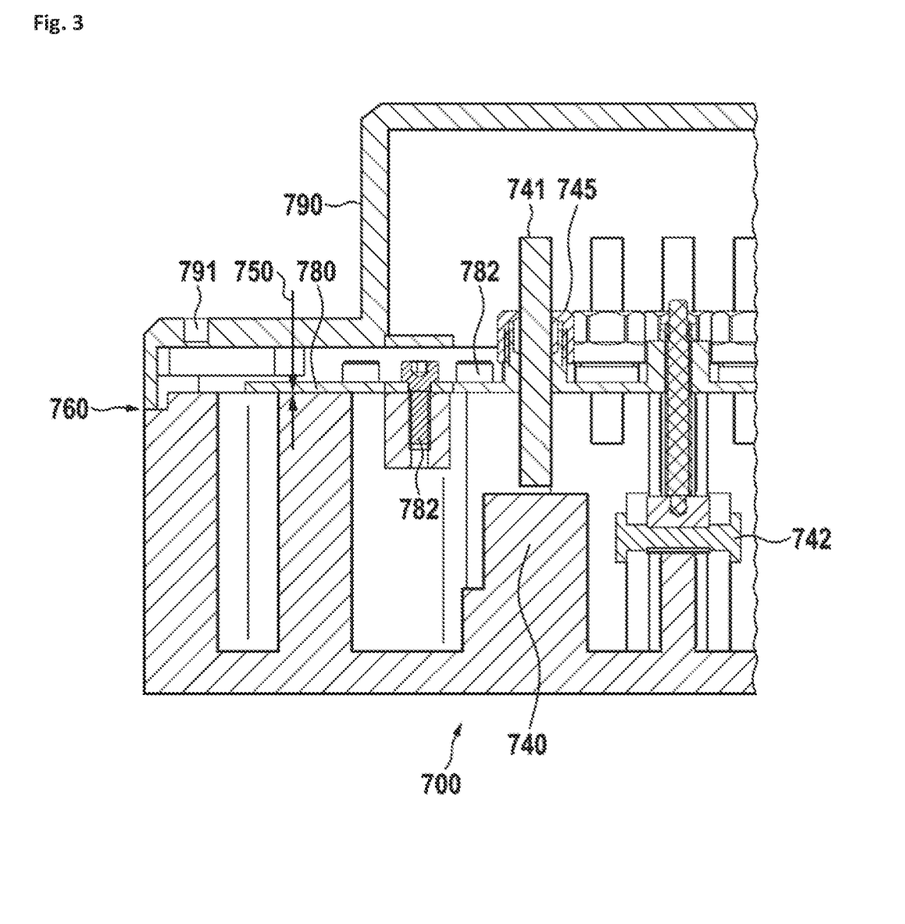
FIG. 3 shows an enlarged section of FIG. 2.

FIG. 3 shows an enlarged section of FIG. 2. Here, the plane of capacitive coupling between the housing body 700 and the cover 780 is marked with arrows 750. Here, a body coupling surface 781 of the cover (oriented towards the cover, as shown in the figure—downwards) mechanically—but not galvanically—contacts a cover coupling surface 710 of the body 700. At least one of the opposing coupling surfaces has a dielectric layer for insulation. The shield 790 is in galvanic contact with the housing body, for example at the circumference of the housing body, as marked with arrow 760. This contact is formed by a body contact surface 795 of the shield 790 contacting a shield contact surface 715 at the body 700.

Figure 4:
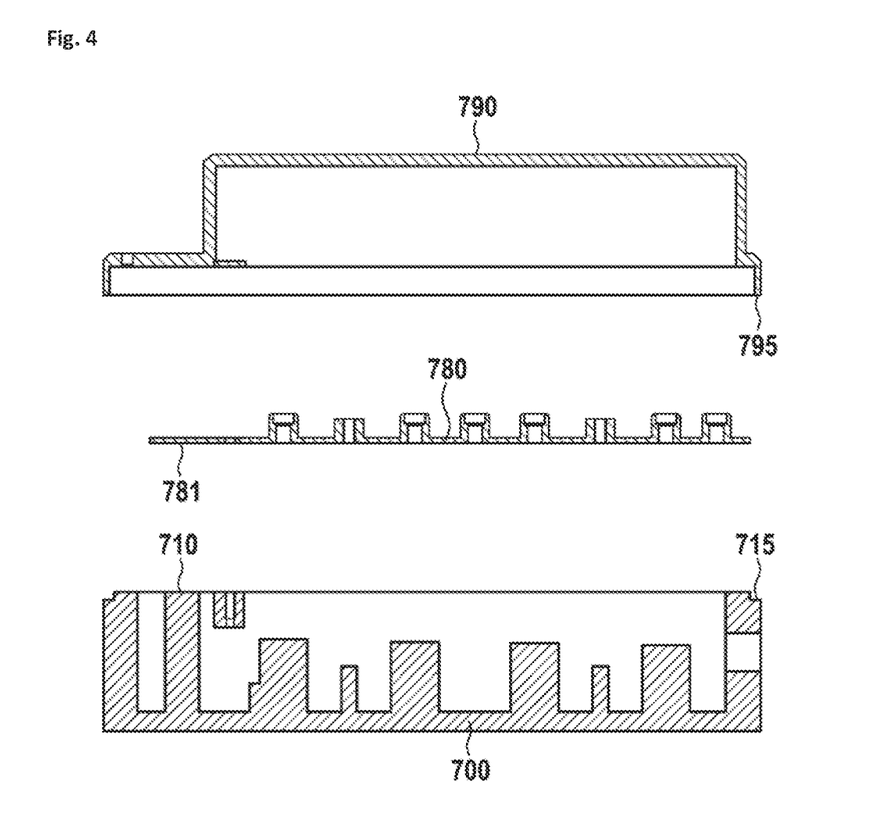
FIG. 4 shows the main components of the housing.

FIG. 4 shows the main components of the housing, the body 700, cover 780 and shield 790 in a disassembled state. Here, the body coupling surface 781 of the cover 780, capacitive coupling to the cover coupling surface 710 of the body 700, and the body contact surface 795 of the shield 790 contacting a shield contact surface 715 at the body 700 are shown.

In FIG. 5, a measurement setup, also referred to as test bench, which meets the requirements of the international standard IEC 62037-1 is shown. Signals in a frequency range 161 are applied to a DUT and the intermodulation signals generated by the DUT are measured in a second frequency range 162. Herein examples are shown with a first frequency range from 1805 MHz to 1880 MHz and a second frequency range from 1710 MHz to 1785 MHz. In related embodiments, other frequencies or frequency ranges may be used. The measurement setup uses the output of a first signal generator 210 generating a sinusoidal signal at a first frequency 218 within the first frequency range and a second signal generator 220 generating a sinusoidal signal at a second frequency 228 within the first frequency range. Preferably, the frequency of each of the signal generators is adjustable in the first frequency range. The signals may be amplified by power amplifiers 211, 221 to the necessary power. Both amplified signals may be combined with a 3 dB directional coupler 230. There may be circulators 212, 222 at the inputs of the directional coupler to increase the isolation of the directional coupler which is necessary to minimize the creation of intermodulation products in the power amplifier. The third port of the circulators preferably is terminated by a circulator termination 213, 223. Preferably, the isolated port of the directional coupler is terminated with a directional coupler termination 231. Instead of combining the two signal generators, a dual signal generator may be used.

After the directional coupler 230, the two combined signals pass a TX path of a duplexer 100 through a first port 131 of the first duplexer via a first duplexer filter 110 through a third port 133 of the first duplexer to a DUT (device under test) 300. The first duplexer filter 110 preferably is a bandpass filter for the first frequency range. The second duplexer filter 120 preferably is a bandpass filter for the second frequency range. The third port 133 is the DUT port 201 of the test bench. The DUT is terminated by a PIM optimized load 280. Such a PIM optimized load has a minimal self-intermodulation which should be significantly below the PIM of the DUT. The intermodulation created in the DUT propagates in both forward and reverse direction. The signal in reverse direction passes through the RX path of the duplexer 100 through the third port 133 via a second duplexer filter 120 through a second port 132. This signal may further be amplified by a LNA (low noise amplifier) 260 and be displayed by a spectrum analyzer 270 or any other suitable device. At the first duplexer port 131 there may be a first isolation filter 240 for the first frequency range and at the second duplexer port 132 there may be a second isolation filter 250 for the second frequency range. These filters are used to increase the isolation to a necessary value of 120 dB. The power of the two sinusoidal signals preferably is adjusted to +43 dBm (20 W) at the third port of the duplexer, which is the standard power for PIM measurements as defined in IEC 62037-1.

Figure 6:
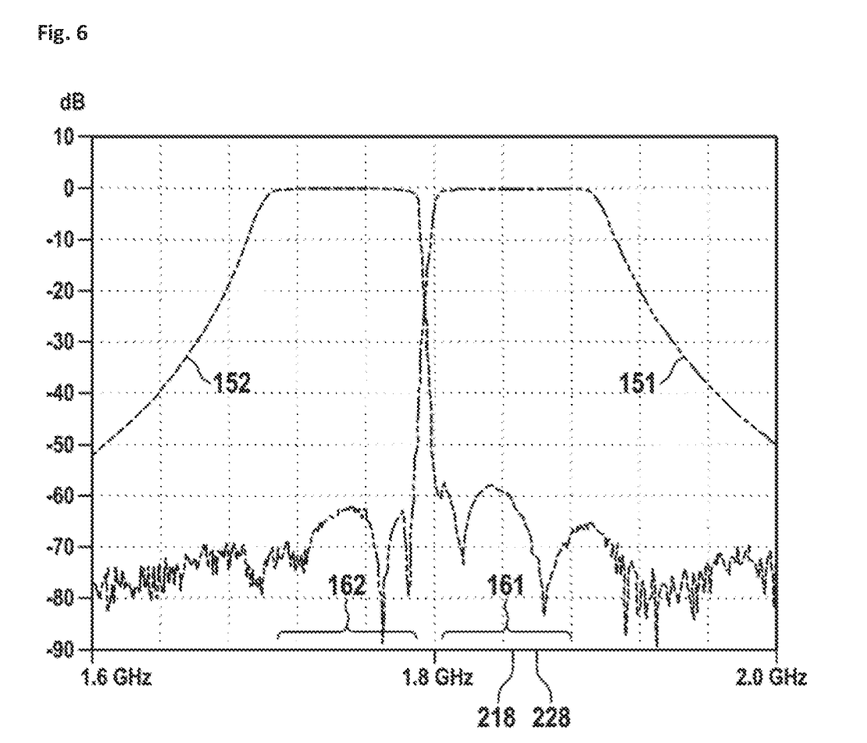
FIG. 6 shows the insertion losses of both paths of the duplexer.

In FIG. 6, the insertion losses of both paths of the duplexer are shown in a frequency range from 1.6 GHz to 2.0 GHz. The curve 151 shows the insertion loss of the transmit (TX) path from the first port 131 of the first duplexer to the third port 133 of the first duplexer, while the curve 152 shows the insertion loss of the receive (RX) path from the third port 133 of the first duplexer to the second port 132 of the first duplexer. The horizontal axis of the diagram shows the frequency in a range from 1.6 GHz to 2.0 GHz. The center frequency is at 1.8 GHz. The vertical axis shows in a logarithmic scale the attenuation of the signal in 10 dB units starting from −90 dB at the bottom to +10 dB at the top. In the diagram the exemplary first frequency range 161 from 1805 MHz to 1880 MHz and the exemplary second frequency range 162 from 1710 MHz to 1785 MHz are marked. Furthermore, an exemplary first frequency 218 and an exemplary second frequency 228 as generated by the first signal generator 210 the second signal generator 220 are marked.

Figure 7:
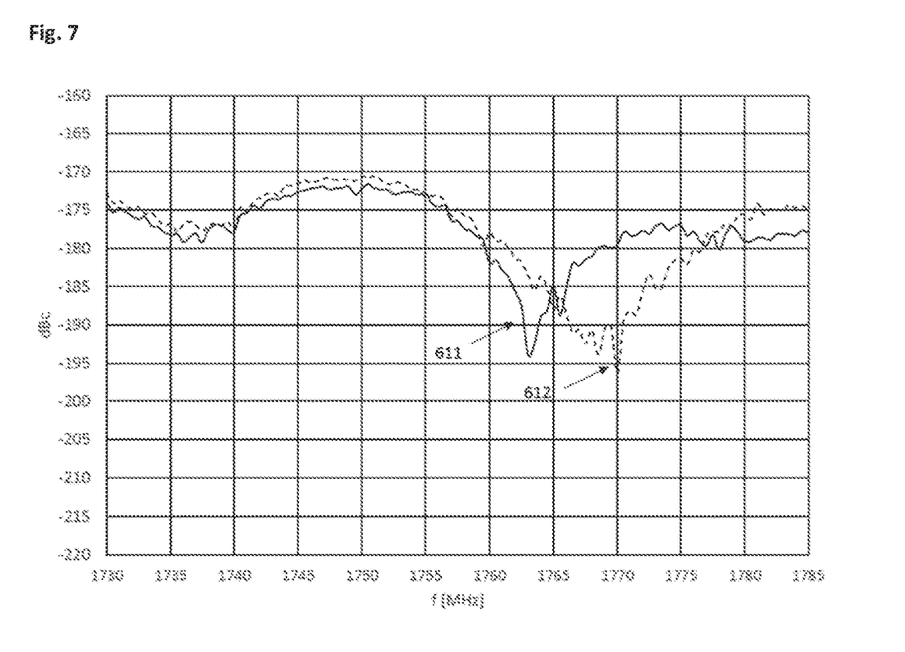
FIG. 7 shows intermodulation curves with a PIM optimized load.

FIG. 7 illustrates the result of the measurement of the 3rd order intermodulation product when the third port of the first duplexer is terminated with a commercially available PIM-optimized load and the carrier frequencies are varied in such a way that the whole bandwidth of the PIM signal displayable with the test bench is used. The first continuous curve 611 shows the intermodulation in the frequency range from 1730 to 1785 MHz, where the first frequency is fixed at 1805 MHz and the second frequency is varied from 1825 to 1880 MHz. The second dashed curve 612 shows the intermodulation from 1730 to 1785 MHz, where the first frequency is varied from 1805 to 1832.5 MHz and the second frequency is fixed at 1880 MHz. The horizontal axis shows the frequency from 1730 to 1785 MHz. The vertical axis shows the level difference between the first and second signal levels (+43 dBm equals to 20 W) and the intermodulation signal in dBc starting from −220 dBc at the bottom to −160 dBc at the top. Apparently, the resulting self-intermodulation of below −171 dBc is not different to that of common PIM test benches.

Figure 8:
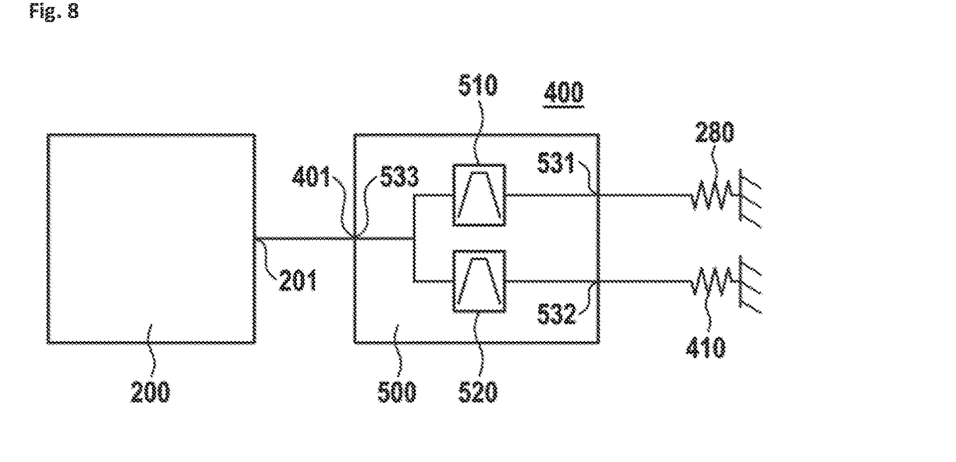
FIG. 8 shows a setup with an improved load.

FIG. 8 depicts a setup with an improved load 400. Here, the DUT port 201 of the test bench 200 is terminated with an improved load 400. This improved load comprises a second duplexer 500 connected via its first port 531 (interchangeably referred to as a fourth port) to a PIM optimized load 280 and via its second port 532 (referred to interchangeably as a fifth port) to a standard load. The TX output of the second duplexer is connected to a PIM-optimized load, the RX output is terminated with a standard load 410. The second duplexer preferably has a first bandpass filter 510 for the first frequency range connected between the fourth port 531 and a third port of the second duplexer 533 (referred to interchangeably as a sixth port). The second duplexer preferably has a second bandpass filter 520 for the second frequency range connected between a second port 532 and the third port 533. The sixth port 533 serves as the improved load input 401. The purpose of the second duplexer 500 is to block the PIM signal created by the PIM-optimized load 280 so that it cannot travel to the test port of the PIM analyzer. A device under test may be connected between the DUT port 201 and the input 401 of the improved load 400.

Figure 9:
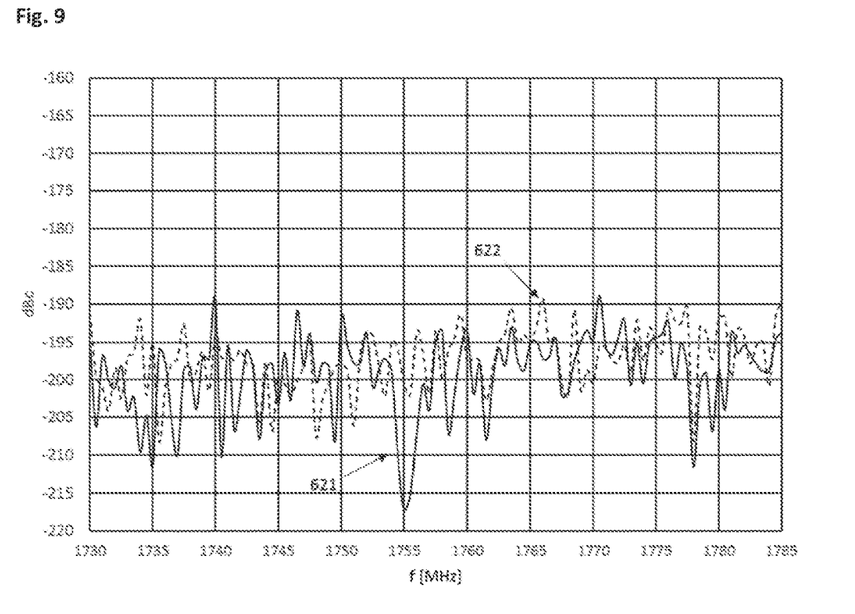
FIG. 9 shows intermodulation curves with an improved load.

FIG. 9 shows a result of the measurement performed with the third port terminated by a second duplexer 500 shown in FIG. 8. The diagram is comparable with that of FIG. 6. Curve 621 depicts the result of the measurement performed under the same conditions as those of the measurement of curve 611. Curve 622 shows a measurement under the same conditions as those of the measurement of curve 612. The intermodulation measured over the whole bandwidth is below −188 dBc which is almost 20 dB better than the best commercially available PIM testers.

Figure 10:
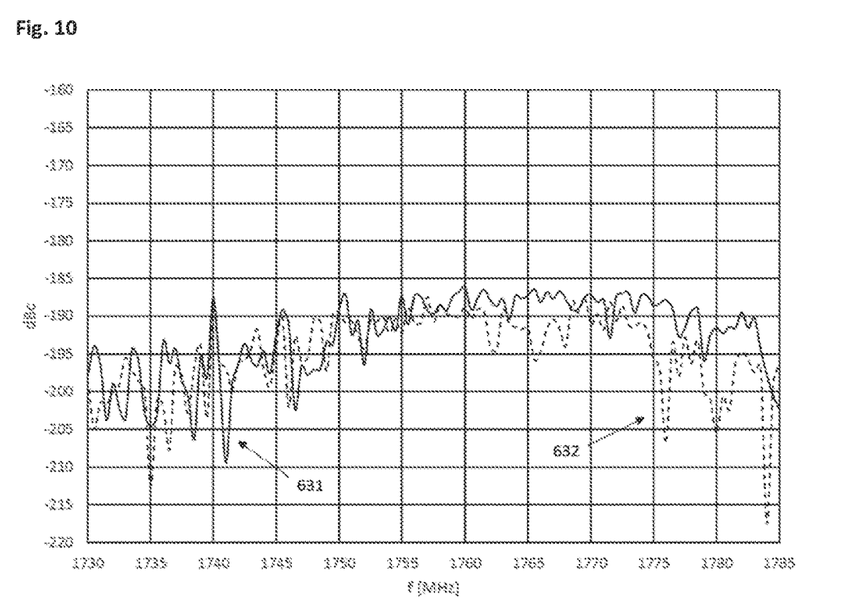
FIG. 10 shows intermodulation curves with improved load and first cable.
Figure 11:
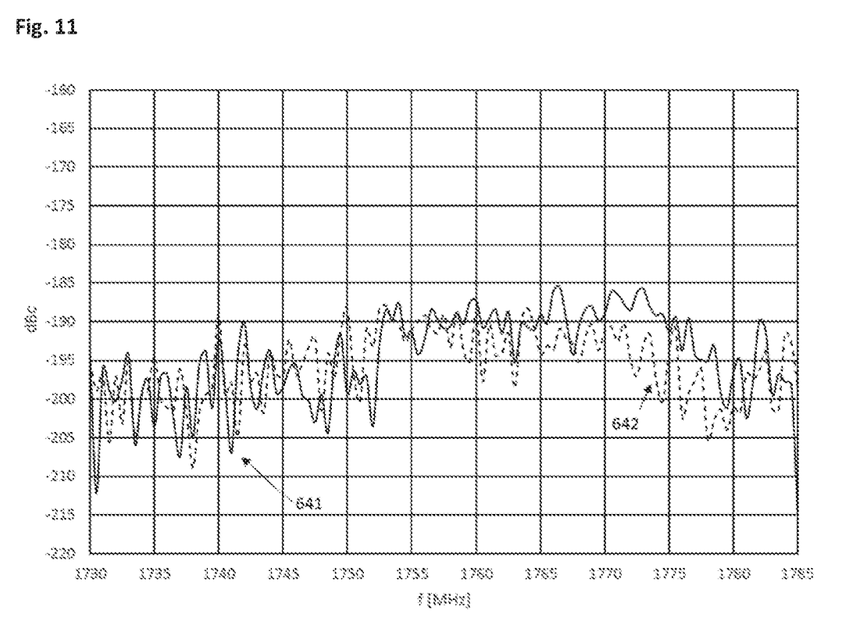
FIG. 11 shows intermodulation curves with improved load and second cable.

FIGS. 10 and 11 show the results of a verification test. It may be possible that result shown above is the consequence of a subtraction of the intermodulation of the test bench and the duplexer used as termination. Therefore, a verification experiment has been done where a factory-fit ½" super-flexible cable has been used between the third port of the test bench and the terminating duplexer of the improved load to achieve a separation of both residual intermodulation products. Two PIM sources separated by a transmission line result in a periodic intermodulation level over frequency with maxima when the signals add up and minima when they cancel each other. The transmission line should have a length causing at least a difference of phase shift of between the upper and lower edge of the observed band. Then a full period of one minimum and one maximum is displayed. Therefore, the length of the cable should be as follows:

$$l = v_{ph}/(2\Delta f)$$

$v_{ph}$ is the phase velocity and $\Delta f$ is the bandwidth of the intermodulation products that can be displayed by the test bench. In our case the phase velocity of the jumper cable is 77% of the speed of light and the displayable frequency range for the 3rd order intermodulation products is 1730 MHz to 1785 MHz within the second frequency range. Hence, the length of a super-flexible ½" cable must be 2.1 m.

The test results are shown for two different cable samples. FIG. 10 shows the results of the same measurements as those of FIG. 9, but carried out with a first cable between the third port of the duplexer and the improved load. Curve 631 corresponds to curve 621 and curve 632 corresponds to curve 622.

FIG. 11 shows the results of the same measurements of FIG. 10, but with another cable having the same length, the second cable between the third port of the duplexer and the improved load. Curve 641 corresponds to curve 631 and curve 642 corresponds to curve 632.

For both measurements the PIM level has a maximum at approx. 1765 MHz and a minimum at approx. 1732 MHz. The result meets the expectation for the frequency dependent behaviour of the intermodulation product when the signals of two sources with an electrical distance of 2.75 m (=2.1 m/77%) add up. As the maximum shows the addition of both signals it may be concluded that the residual PIM of the test bench is better than −185 dBc at +43 dBm carrier power over the whole measurement band.

It has to be mentioned that this verification approach may still have a relative shortcoming: It is assumed that the PIM of the coaxial cable is negligible. However, the cable and the connectors are made from linear materials and the junctions between the inner and outer conductors of the cable and the factory fit connectors are soldered which should lead to very small intermodulation products. Additionally, the test has been performed for many cable samples with a similar result. Thus, it is very likely that the measurement represents the residual PIM of the test bench instead of the self-intermodulation of the cable.

It will be appreciated to those skilled in the art having the benefit of this disclosure that this invention is believed to provide filters and housings thereof. Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

LIST OF REFERENCE NUMERALS 100 duplexer (first duplexer)
110 first duplexer filter of the first duplexer
120 second duplexer filter of the first duplexer
131 first port of the first duplexer
132 second port of the first duplexer
133 third port of the first duplexer
151 insertion loss first port to third port
152 insertion loss third port to second port
161 first frequency range
162 second frequency range
200 PIM test bench
201 Test bench DUT port
210 first signal generator
211 first power amplifier
212 first circulator
213 first circulator termination
218 first frequency
220 second signal generator
221 second power amplifier
222 second circulator
223 second circulator termination
228 second frequency
230 directional coupler
231 directional coupler termination
240 first isolation filter
250 second isolation filter
260 LNA (low noise amplifier)
270 spectrum analyzer
280 PIM optimized load
300 DUT (device under test)
400 improved load
401 improved load input
410 standard load
500 second duplexer
510 first duplexer filter of the second duplexer
520 second duplexer filter of the second duplexer
531 fourth port (first port of the second duplexer)
532 fifth port (second port of the second duplexer)
533 sixth port (third port of the second duplexer)
611 first intermodulation curve with PIM optimized load
612 second intermodulation curve with PIM optimized load
621 first intermodulation curve with improved load
622 second intermodulation curve with improved load
631 first intermodulation curve with improved load and first cable
632 second intermodulation curve with improved load and first cable
641 first intermodulation curve with improved load and second cable
642 second intermodulation curve with improved load and second cable
700 duplexer housing body 710 cover coupling surface
711 holes for insulated screws
715 shield contact surface
719 hollow space
720 contact strips
740 resonator rods
741 tuning element
731 first port connector
732 second port connector
733 third port connector
736 first port capacitive coupler
737 second port capacitive coupler
738 third port capacitive coupler
740 coaxial resonator rods
741 dielectric tuning elements
742 inter-resonator couplings
745 fixing nut for tuning elements
750 capacitive coupling
760 galvanic contact
780 metal cover
781 body coupling surface
782 insulated screws
790 shield
795 body contact surface

The invention claimed is:

1. A filter for radio-frequency (RF) signals, the filter comprising:
multiple filter components including at least one coaxial resonator rod, and
a metal housing enclosing said filter components,
wherein the housing comprises a monolithic metal housing body and a metal housing cover capacitively coupled to the metal body without any galvanic contact.

2. The filter according to claim 1, wherein the at least one coaxial resonator rod is configured as at least part of the housing body.

3. The filter according to claim 1, wherein the metal housing cover includes surfaces oriented towards the metal housing body, and wherein the metal housing cover has a dielectric layer at at least said surfaces or over a whole surface from said surfaces.

4. The filter according to claim 1, wherein the metal housing body includes surfaces oriented towards the metal housing cover, wherein the metal housing body has a dielectric layer at at least said surfaces or over a whole surface from said surfaces.

5. The filter according to claim 1, wherein the metal housing body has a cover coupling surface and the metal housing cover has a body coupling surface, the cover coupling surface and the body coupling surface geometrically matching each other.

6. The filter according to claim 5, wherein at least one of the cover coupling surface and the body coupling surface has a dielectric layer.

7. The filter according to claim 6, wherein the dielectric layer comprises at least one of a coating, an oxide layer, an anodized layer, an oxide, a ceramic material, paint, a plastic film, a polymer material, and a combination thereof.

8. The filter according to claim 1, wherein the metal housing cover is affixed to the metal housing body by means comprising an insulating material.

9. The filter according to claim 8, wherein the insulating material includes any of glass-fiber-reinforced plastic screws, bolts, and pins.

10. The filter according to claim 1, wherein the metal housing cover is covered with a shield.

11. The filter according to claim 10, wherein the shield has at least one body contact surface and the metal body has at least one shield contact surface, wherein the at least one body contact surface of the shield is in galvanic contact with the at least one shield contact surface of the body.

12. The filter according to claim 1, configured as a duplexer having first, second, and third ports,
wherein the first and third ports are connected with one another via a first RF circuitry path and the second and third ports are connected with one another via a second RF circuitry path,
wherein a first RF circuitry defining the first RF circuitry path is configured as a first bandpass filter including a first coaxial rod from said at least one coaxial rod, and
wherein a second RF circuitry defining the second RF circuitry path is configured as a second bandpass filter that includes a second coaxial rod from said at least one coaxial rod.

13. The filter according to claim 1, configured as a duplexer that has a first port, a second port, and a third port, wherein the first and third ports are connected with one another via a first RF circuitry path and the second and third ports are connected with one another via a second RF circuitry path, wherein an RF circuitry defining a path from the first and second RF circuitry paths includes six elliptic cavity filter elements, said six elliptic cavity filter elements including said at least one coaxial resonator rod.

14. The filter according to claim 13, wherein the six elliptic cavity filter elements are configured as two triplets of cavity filter elements.

15. The filter according to claim 1, further configured to satisfy at least one of the following conditions:
the filter contains at least one capacitive port coupler,
the filter contains at least one port coupler that is part of a monolithic inner conductor of a connector,
the filter contains at least one tuning element for a resonator,
the filter contains at least one inter-resonator coupling that is made of aluminum and has a dielectric layer,
the filter contains a nut configured to fix the at least one tuning element while not having a galvanic contact with either the at least one tuning element or the cover,
wherein all components of the multiple components of the filter are monolithic parts and further comprising a dielectric coating between first and second components of said multiple component to avoid galvanic contact between the first and second components,
wherein each capacitance, from capacitances formed by said multiple components of the filter, is characterized by impedance equal to impedance of a galvanic contact in a pre-defined frequency range while not negatively affecting linearity of said each capacitance.

16. The filter according to claim 15, wherein the at least one tuning element for the resonator comprises aluminum oxide.

17. A PIM test bench configured to test a device under test (DUT), the bench comprising:
at least one filter according to claim 1,
wherein the at least one filter includes a first filter configured as a first duplexer having first, second, and third ports,
wherein the first and third ports are connected with one another via a first RF circuitry path and the second and third ports are connected with one another via a second RF circuitry path, wherein a first RF circuitry defining the first RF circuitry path is configured as a first bandpass filter including a first coaxial rod from said at least one coaxial rod, and wherein a second RF circuitry defining the second RF circuitry path is configured as a second bandpass filter that includes a second coaxial rod from said at least one coaxial rod, at least one RF signal source configured to provide RF signals at a first frequency and at a second frequency, the at least one RF signal source connected to the first port, a spectrum analyzer connected to the second port, and a load, wherein the bench is configured to have, in operation, a first DUT sequentially connected to the third port and the load sequentially connected to the first DUT.

18. The PIM test bench according to claim 17, wherein the at least one filter includes a second filter configured as a second duplexer, and further comprising a standard load, the second duplexer having fourth, fifth, and sixth ports, wherein the fourth and six ports are connected with one another via a third RF circuitry path and the fifth and sixth ports are connected with one another via a fourth RF circuitry path, wherein a third RF circuitry defining the third RF circuitry path is configured as a third bandpass filter, and wherein a fourth RF circuitry defining the fourth RF circuitry path is configured as a fourth bandpass, the second duplexer being connected:
with the sixth port to the third port of the first duplexer,
with either the fourth port or the fifth port to the load, and
with the fourth port or the fifth port to the standard load, wherein the bench is configured to have, in operation, a second DUT connected to and between the third port and the sixth port of the second duplexer.

19. A filter for radio-frequency (RF) signals, the filter comprising:

multiple filter components including at least one coaxial resonator rod, and a metal housing enclosing said filter components, wherein the metal housing comprises a monolithic metal housing body and a metal housing cover that is capacitively coupled to the metal housing body without any galvanic contact, and wherein the metal housing cover includes surfaces oriented towards the metal housing body, and wherein the metal housing cover has a dielectric layer at at least one surface thereof that is oriented towards the metal housing body.

20. A filter for radio-frequency (RF) signals, the filter comprising:

multiple filter components including at least one coaxial resonator rod, and a metal housing enclosing said filter components, and a shield covering the metal housing, wherein the metal housing comprises a monolithic metal housing body and a metal housing cover that is capacitively coupled to the metal housing body without any galvanic contact.

* * * * *

UNITED STATES PATENT AND TRADEMARK OFFICE
CERTIFICATE OF CORRECTION

PATENT NO. : 10,403,949 B2  
APPLICATION NO. : 16/053303  
DATED : September 3, 2019  
INVENTOR(S) : Martin Grassl et al.

It is certified that error appears in the above-identified patent and that said Letters Patent is hereby corrected as shown below:

On the Title Page

Item (54) and in the Specification, Column 1, Line 1, the title of the invention:
"RE-FILTERS FOR PIM MEASUREMENTS AND A TEST BENCH UTILIZING SAME", Should be:
-- RF-FILTERS FOR PIM MEASUREMENTS AND A TEST BENCH UTILIZING SAME --

Signed and Sealed this
Eighth Day of October, 2019

Andrei Iancu
*Director of the United States Patent and Trademark Office*